United States Patent
Schleifer

(10) Patent No.: US 7,180,282 B2
(45) Date of Patent: *Feb. 20, 2007

(54) APPARATUS FOR METERING AT LEAST ONE TYPE OF ELECTRICAL POWER OVER A PREDETERMINED RANGE OF SERVICE VOLTAGES

(75) Inventor: Fred F. Schleifer, Elk Mound, WI (US)

(73) Assignee: Elster Electricity, LLC, Raleigh, NC (US)

( * ) Notice: Subject to any disclaimer, the term of this patent is extended or adjusted under 35 U.S.C. 154(b) by 19 days.

This patent is subject to a terminal disclaimer.

(21) Appl. No.: 10/617,844

(22) Filed: Jul. 11, 2003

(65) Prior Publication Data

US 2004/0105206 A1    Jun. 3, 2004

Related U.S. Application Data

(60) Continuation of application No. 10/076,990, filed on Feb. 15, 2002, now abandoned, which is a continu- (Continued)

(51) Int. Cl.
*G01R 11/32* (2006.01)
(52) U.S. Cl. .................. 324/142; 324/127; 323/356
(58) Field of Classification Search ........... 323/220, 323/229, 231, 232, 247, 259, 299, 301, 304, 323/305, 355, 358, 359, 361, 363; 324/141, 324/142
See application file for complete search history.

(56) References Cited

U.S. PATENT DOCUMENTS 2,724,821 A    11/1955 Schweitzer, Jr.

(Continued)

FOREIGN PATENT DOCUMENTS

AU    68113/87    8/1987

(Continued)

OTHER PUBLICATIONS

Schlumberger's Third Supplemental Answers to ABB's First Set of Interrogatories (Nos. 1-22), In the United States District Court for the District of Delaware, *ABB Automation, Inc., v. Schlumberger Resource Management Services, Inc.*, Case No. 01-77SLR, Sep. 6, 2002.

(Continued)

*Primary Examiner*—Minh N. Tang
(74) *Attorney, Agent, or Firm*—Woodcock Washburn LLP

(57) ABSTRACT

Methods and apparatus for supplying power for use in metering electrical energy over a wide range of voltages with a single meter are disclosed. The wide ranging meter includes a processing unit for processing divided input voltage and a current component in order to determine electrical energy metering values. The processing unit is operable in response to supply voltages. A power supply, connected to receive the undivided voltage component, generates the supply voltages over the wide dynamic range. It is especially preferred for the power supply to include a transformer having first, second and third windings, wherein the undivided voltage component is provided to the first winding and wherein the second winding defines the output of the power supply. A switching member is connected to the first winding for permitting and preventing the flow of current in response to a control signal. A control member generates the control signal in response to the output of the power supply. It is also preferred for the control signal to disable the witch member. It is further preferred for the power supply to include a voltage blocking clamp, connected to the transformer for blocking the voltage applied to the transformer. It is still further preferred for an oscillator to be used to generate an oscillating signal for switching the switching member ON and OFF so that the switching member is provided a substantially constant OFF time.

13 Claims, 6 Drawing Sheets

Related U.S. Application Data ation of application No. 09/781,501, filed on Feb. 12, 2001, now abandoned, which is a division of application No. 09/047,479, filed on Mar. 25, 1998, now Pat. No. 6,229,295, which is a continuation of application No. 08/478,605, filed on Jun. 7, 1995, now Pat. No. 5,903,145, which is a continuation of application No. 08/384,398, filed on Feb. 3, 1995, now Pat. No. 5,457,621, which is a continuation of application No. 08/259,116, filed on Jun. 10, 1994, now abandoned, which is a continuation of application No. 07/839,967, filed on Feb. 21, 1992, now abandoned.

U.S. PATENT DOCUMENTS

| Patent No. | Date | Inventor | Class |
|---|---|---|---|
| 3,569,818 A | 3/1971 | Dahlinger et al. | 363/21.12 |
| 3,794,917 A | 2/1974 | Martin et al. | |
| 3,806,875 A | 4/1974 | Georget | |
| 3,826,985 A | 7/1974 | Wiley | |
| 3,976,941 A | 8/1976 | Milkovic | |
| 4,007,061 A | 2/1977 | Le Couturier | |
| 4,034,292 A | 7/1977 | McClelland, III | |
| 4,055,803 A * | 10/1977 | Kraley et al. | 324/142 |
| 4,077,061 A | 2/1978 | Johnston et al. | |
| 4,092,592 A | 5/1978 | Milkovic | |
| 4,096,436 A | 6/1978 | Cook et al. | |
| 4,119,948 A | 10/1978 | Ward et al. | |
| 4,120,031 A | 10/1978 | Kincheloe et al. | |
| 4,131,844 A | 12/1978 | Hucker et al. | |
| 4,156,273 A | 5/1979 | Sato | |
| 4,156,931 A | 5/1979 | Adelman et al. | |
| 4,156,932 A | 5/1979 | Robinson et al. | |
| 4,158,810 A | 6/1979 | Leskovar | |
| 4,186,339 A | 1/1980 | Finger | |
| 4,209,826 A | 6/1980 | Priegnitz | |
| 4,213,119 A | 7/1980 | Ward et al. | |
| 4,241,237 A | 12/1980 | Paraskevakos et al. | 379/106.06 |
| 4,283,772 A | 8/1981 | Johnston | |
| 4,291,375 A | 9/1981 | Wolf | |
| 4,298,839 A | 11/1981 | Johnston | |
| 4,301,508 A | 11/1981 | Anderson et al. | |
| 4,315,248 A | 2/1982 | Ward | |
| 4,335,445 A | 6/1982 | Nercessian | |
| 4,335,447 A | 6/1982 | Jerrim | 714/22 |
| 4,355,361 A | 10/1982 | Riggs et al. | |
| 4,359,684 A | 11/1982 | Ley | |
| 4,361,877 A | 11/1982 | Dyer et al. | |
| 4,378,524 A | 3/1983 | Steinmüller | |
| 4,389,702 A | 6/1983 | Clemente et al. | |
| 4,399,510 A | 8/1983 | Hicks | |
| 4,407,061 A | 10/1983 | Grodkiewicz et al. | |
| 4,415,853 A | 11/1983 | Fisher | |
| 4,420,721 A | 12/1983 | Dorey et al. | |
| 4,422,039 A | 12/1983 | Davis | |
| 4,437,059 A | 3/1984 | Hauptmann | |
| 4,438,485 A | 3/1984 | Voigt | |
| 4,439,764 A | 3/1984 | York et al. | |
| 4,455,453 A | 6/1984 | Parasekvakos et al. | 379/106.06 |
| 4,467,434 A | 8/1984 | Hurley et al. | |
| 4,489,384 A | 12/1984 | Hurley et al. | |
| 4,497,017 A | 1/1985 | Davis | |
| 4,509,128 A | 4/1985 | Coppola et al. | |
| 4,516,213 A | 5/1985 | Gidden | |
| 4,542,469 A | 9/1985 | Brandyberry et al. | |
| 4,566,060 A | 1/1986 | Hoeksma | |
| 4,581,705 A | 4/1986 | Gilker et al. | |
| 4,600,881 A | 7/1986 | La Rocca et al. | |
| 4,607,320 A | 8/1986 | Matui et al. | |
| 4,620,150 A | 10/1986 | Germer et al. | 324/103.12 |
| 4,621,330 A | 11/1986 | Weikel | |
| 4,622,627 A | 11/1986 | Rodriguez et al. | |
| 4,623,960 A | 11/1986 | Eng | |
| 4,639,728 A | 1/1987 | Swanson | 340/870.03 |
| 4,642,634 A | 2/1987 | Gerri et al. | |
| 4,646,084 A | 2/1987 | Burrowes et al. | |
| 4,682,169 A | 7/1987 | Swanson | 379/102.07 |
| 4,686,460 A | 8/1987 | Stevens et al. | |
| 4,692,874 A | 9/1987 | Mihara | |
| 4,697,180 A | 9/1987 | Swanson | |
| 4,697,181 A | 9/1987 | Swanson | 340/870.02 |
| 4,697,182 A | 9/1987 | Swanson | 340/870.02 |
| 4,700,280 A | 10/1987 | Onda et al. | |
| 4,701,858 A | 10/1987 | Stokes et al. | |
| 4,713,608 A | 12/1987 | Catiller et al. | |
| 4,754,219 A | 6/1988 | Milkovic | |
| 4,757,456 A | 7/1988 | Benghiat | |
| 4,761,725 A | 8/1988 | Henze | |
| 4,794,369 A | 12/1988 | Haferd | |
| 4,803,632 A | 2/1989 | Frew et al. | |
| 4,804,957 A | 2/1989 | Selph et al. | 340/870.03 |
| 4,814,757 A | 3/1989 | Patterson et al. | |
| 4,831,327 A | 5/1989 | Chénier et al. | |
| 4,853,620 A | 8/1989 | Halder et al. | |
| 4,862,493 A | 8/1989 | Venkataraman et al. | |
| 4,866,587 A | 9/1989 | Wadlington | |
| 4,881,027 A | 11/1989 | Joder et al. | |
| 4,881,070 A | 11/1989 | Burrowes et al. | |
| 4,884,021 A | 11/1989 | Hammond et al. | |
| 4,896,106 A | 1/1990 | Voisine et al. | |
| 4,902,964 A | 2/1990 | Szabela et al. | |
| 4,902,965 A | 2/1990 | Bodrug et al. | |
| 4,908,569 A | 3/1990 | Fest | |
| 4,908,769 A | 3/1990 | Vaughan et al. | |
| 4,922,187 A | 5/1990 | Beverly, II | |
| 4,922,399 A | 5/1990 | Tsuzuki | |
| 4,931,725 A | 6/1990 | Hutt et al. | |
| 4,949,029 A | 8/1990 | Cooper et al. | |
| 4,951,052 A | 8/1990 | Jacob et al. | |
| 4,956,761 A | 9/1990 | Higashi | |
| 4,975,592 A | 12/1990 | Hahn et al. | |
| 4,977,368 A | 12/1990 | Munday et al. | |
| 4,978,911 A | 12/1990 | Perry et al. | |
| 4,998,061 A | 3/1991 | Voisine et al. | |
| 4,999,569 A | 3/1991 | Weikel | |
| 4,999,572 A | 3/1991 | Bickford et al. | 324/103 R |
| 5,010,335 A | 4/1991 | Coppola et al. | |
| 5,014,213 A | 5/1991 | Edwards et al. | |
| 5,017,860 A | 5/1991 | Germer et al. | |
| 5,019,955 A | 5/1991 | Hoeksma | |
| 5,032,785 A | 7/1991 | Mathis et al. | |
| 5,059,896 A | 10/1991 | Germer et al. | |
| 5,122,735 A | 6/1992 | Porter et al. | |
| 5,140,511 A | 8/1992 | Lee et al. | |
| 5,146,394 A | 9/1992 | Ishii et al. | 363/16 |
| 5,151,866 A | 9/1992 | Glaser et al. | |
| 5,153,837 A | 10/1992 | Shaffer et al. | |
| 5,173,657 A | 12/1992 | Holdsclaw | |
| 5,175,675 A | 12/1992 | Uramoto | |
| 5,181,026 A | 1/1993 | Granville | |
| 5,184,064 A | 2/1993 | Vicknair et al. | |
| 5,229,713 A | 7/1993 | Bullock et al. | |
| 5,237,511 A | 8/1993 | Caird et al. | 702/58 |
| 5,245,275 A | 9/1993 | Germer et al. | |
| 5,268,633 A | 12/1993 | Balch | |
| 5,270,958 A | 12/1993 | Dastous | |
| 5,287,287 A | 2/1994 | Chamberlain et al. | |
| 5,289,115 A | 2/1994 | Germer et al. | 324/107 |
| 5,296,803 A | 3/1994 | Kirby et al. | |
| 5,315,527 A | 5/1994 | Beckwith | |
| 5,325,051 A | 6/1994 | Germer et al. | |
| 5,391,983 A | 2/1995 | Lusignan et al. | |
| 5,457,621 A | 10/1995 | Munday et al. | |
| 5,469,049 A | 11/1995 | Briese et al. | 324/76.77 |

| | | | |
|---|---|---|---|
| 5,471,137 A | 11/1995 | Briese et al. | 324/158.1 |
| 5,495,167 A | 2/1996 | Cotroneo | |
| 5,537,029 A | 7/1996 | Hemminger et al. | |
| 5,537,333 A | 7/1996 | Hemminger et al. | 702/60 |
| 5,539,304 A | 7/1996 | Payne et al. | |
| 5,544,089 A | 8/1996 | Hemminger et al. | |
| 5,548,209 A | 8/1996 | Lusignan et al. | |
| 5,548,527 A | 8/1996 | Hemminger et al. | |
| 5,555,508 A | 9/1996 | Munday et al. | |
| 5,621,629 A | 4/1997 | Hemminger et al. | 363/56 |
| 5,631,554 A | 5/1997 | Briese et al. | 324/76.77 |
| 5,631,843 A | 5/1997 | Munday et al. | 700/286 |
| 5,691,634 A | 11/1997 | Lowe | 324/107 |
| 5,742,151 A | 4/1998 | Hwang | 323/222 |
| 5,808,455 A | 9/1998 | Schwartz et al. | 323/271 |
| 5,903,145 A | 5/1999 | Hemminger et al. | |
| 6,097,182 A | 8/2000 | Hemminger et al. | 324/142 |
| 6,229,295 B1 | 5/2001 | Hemminger et al. | |

FOREIGN PATENT DOCUMENTS

| | | |
|---|---|---|
| EP | 0 092 303 B1 | 10/1986 |
| EP | 0 288 413 A1 | 10/1988 |
| EP | 0 462 045 A1 | 12/1991 |
| GB | 2 095 879 | 1/1982 |
| GB | 2177 805 A | 1/1987 |
| JP | 61-11680 | 1/1986 |
| JP | 61-38569 | 2/1986 |
| JP | 61-284670 | 12/1986 |
| JP | 1-239473 | 9/1989 |
| JP | 1-239474 | 9/1989 |
| JP | 1-239475 | 9/1989 |
| WO | WO 86/05887 | 10/1986 |

OTHER PUBLICATIONS

Quantum® ST-Q121 Electronic Meter, Product Bulletin 10254, Effective Date Oct. 1990, pp. 1-22.
Quantum® Q200 Series System Measurement, Product Bulletin 10255, Effective Date Nov. 1990, 25 pages.
Quantum® Q101 Series Electronic Meter, Product Bulletin 10253, Effective Jun. 1991, 20 pages.
Second Amended Complaint for Patent Infringement and for Declaratory Judgment of Non-Infringement, Invalidity and/or that Schlumberger is not Entitled to Relief, In the United States District Court for the District of Delaware, *ABB Automation, Inc.,* v. *Schlumberger Resource Management Services, Inc.*, Case No. 01-77SLR, Jul. 25, 2001.
P.R. Hutt, et al, "Design, Benefits and Flexibility in Intelligent Metering Technology," Polymeters Limited, UK, date unavailable.
Summer, S.E. et al., "Wide Input Range Multiple Output Power Supply", *PCI*, Apr. 1983, 228-236.
RM-10 Metronic Portable Watthour Standard-Operations Manual Revisions E, Feb. 1990, Radian Research, Inc., Power and Energy Measurement Specialists.
RM-10, RM-12, RM-15 Operations Manual, Radian Research, Inc., date unavailable.
"Enter the Electronic Metering Age With GE, The Electronic Polyphase Demand Meter, GE Electronic Metering," *GE Meters Brochure*, Somersworth, NH, Sep. 1989.
G.A. Kingston, et al., "Multi Function Polyphase Metering—An Integrated Approach," Schlumberger Industries Electricity Management, UK, no date.
Garverick, Steven L. et al., A Programmable Mixed-Signal ASIC of Power Metering, ISSCC91/Session 2/Low-Temperature Circuits and Special-Purpose Processors/Paper WP 2.4, IEEE International Solid—State Circuits Conference, 1991, no month.
Garverick, Steven L, et al., "A Programmable Mixed-Signal ASIC for Power Metering," IEEE Journal of Solid-State Circuits, vol. 26, No. 12, Dec. 1991.
H. Kohler, "Elektronischer Hochprazisionzahler im 19-Zoll-Einbaughehause fur Wirkverbrauch-und Blindverbrauchzuhlung," Siemens Magazine, pp. 345-349, 1977, no month.
HP Eggenberger, "Ein Elektronischer Elektrizitatazahler fur Wir -und Blindverauch," Neue Zurcher Zeitung, Sep. 6, 1989.
Landis & Gyr, "Electronic Meter, 2:ZFRI, ZMRI," Jul. 1971.
Landis & Gyr Bulletin 920 Instruction/Technical Manual, Solid State Meter, Form 9S, 1$^{st}$ printing Mar. 1987.
Landis & Gyr, Bulletin 930 SSM2 Instruction/Technical Manual Polyphase Solid State Meter, Landis & Gyr, Lafayette, Indiana, (date unavailable).
Landis & Gyr, ZMA110m402—Solid State Precision Meter IEC, no date.
Landis & Gyr, Z.T. Precision Solid-State Meters, Oct. 1988.
Laumann, H., et al., "Precision Meter With Solid-State Measuring Elements," Landis & Gyr Review, Sep. 1974.
Lester, G., "A Communications Protocol For Reading and Programming Electronic Metering Devices From Hand Held Units," GEC Meters, UK, no date.
M. Schwendtner, et al., "Elektronischer Haushaltszahler" Elektrontechnische Zeitschrift etz, vol. 112, No. 6-7, 1991, pp. 320-323, together with an English translations of the same (Electronic Domestic Meter), no month.
McGrath, Donald T, Signal Processing Considerations in Power Management Applications, GE Corporate Research and Development, 1991, no month.
MT100 Electronic Time-of-Use Register Instruction Manual 0505, Schlumberger Industries, Dec. 1991.
Negahaban, M., A DSP Based Watthour Meter, Silicon Systems, Inc., Nov. 23, 1988.
Negahban, M. et al. "A DSP-Based Watthour Meter" IEEE International Solid State Circuits Conference Digest of Technical Papers 36th ISSC 1st Ed. NY, NY, USA Feb. 15-17, 1989.
Nilsen, "EMS 2100 Electricity Consumption Analyzer-Australian Design Award 1998," pp. 1-16, no month.
Product Brochure: "KVI Polyphase Combination Meter," Dated Jul. 1988.
Progress in the Art of Metering Electric Energy, Institute of Electrical & Electronic Engineers, Electricity Metering Subcommittee, 1969, no month.
QUAD4® Plus Multifunction Electronic Meter, User's Guide, Document A-117350, Revision L., Process Systems, Charlotte, NC, 1993, no month.
Quantum Multi-Function Polyphase Meter Type SQ400, Preliminary Instruction Manual Draft III, Mar. 1983.
Quantum Technical Guide, Jul. 1989.
Quantum Electronic Meter Field Reference Manual For Q101, Q111, Q121 Q200, Q210, Q220 and Q230 Electronic Meters, Schlumberger Industries, prior to 1991, no month.
ST-MT100 Electronic Time-of-Use Instruction Manual 0505, Sangamo Westing, Inc., May 1987.
ST-Q101 Series Electronic Meter, Product Bulletin 10253, Schlumberger Industries, Sep. 1988.
ST-Q200 Series System Measurement, Product Bulletin 10255, Schlumberger Industruses, 1988, no month.
ST-Q200 Series System Measurement, Product Bulletin 10255, Schlumberger Industries Nov. 1990.

Su, Kendall L., "Fundamentals of Circuits, Electronics and Signal Analysis," Georgia Institute of Technology, Atlanta, GA, vol. 1, pp. 61-63, Dec. 1996.

Summers, R., Integrated Semiconductor Solutions For Metering and Telemetering Applications, Texas Instruments, Apr. 1990.

Three-Phase, Watt-Hour Meter IC, Electronic Design, Feb. 23, 1989.

Usenko, VV et al. "Meter For Recording the Energy of Single and Rarely-Repeateing Ultrahigh-Energy Pulses," Radiotekhnika, Kharkov, Ukranian SSR, No. 86, pp. 44-48, 1988, 2 REF, no month.

Hutt, P.R. et al., "Design, Benefits and Flexibility in Intelligent Metering Technology", *Polymers Limited*, United Kingdom, 67-71, no date.

ST-DS130 Recorder Module Product Bulletin 13157, Schlumberger Industries, Sep. 1988, no date.

Memorandum Order(Claim Construction)- In the United States District Court for the District of Delaware, *ABB Automation, Inc., v. Schlumberger Resource Management Services, Inc.*, Civil Action No. 01-077-SLR, Mar. 27, 2003.

Complaint for Patent Infringement of U.S. Appl. Nos. 5,548,527, 5,555,508, 5,457,621, 5,7621,629, 5,903,145, and 6,097,182 and for Declaratory Judgment of Non-Infringement and Invalidity of U.S. Appl. No. 5,469,049, 5,471,137, and 5,631,554, In the United States District Court for the District of Delaware, *ABB Automation, Inc., v. Schlumberger Resource Management Services, Inc.*, Case No. 01-77, Feb. 12, 2001.

First Amended Complaint for Patent Infringement and for Declaratory Judgment of Non-Infringement, Invalidity and/or that Schlumberger is not Entitled to Relief, In the United States District Court for the District of Delaware, *ABB Automation, Inc., v. Schlumberger Resource Management Services, Inc.*, Case No. 01-77, Jun. 12, 2001.

Answer and Affirmative Defense to First Amended Complaint and Counterclaims for Declaratory Judgment of Non-Infringement, Invalidity and/or Unenforceability and for Patent Infrngement, In the United States District Court for the District of Delaware, *ABB Automation, Inc., v. Schlumberger Resource Management Services, Inc.*, Case No. 01-77, Jul. 2, 2001.

Answer and Affirmative Defenses to Second Amended Complaint and Counterclaims for Declaratory Judgment of Non-Infringement, Invalidity, and/or Unenforceability and for Patent Infringement, In the United States District Court for the District of Delaware, *ABB Automation, Inc., v. Schlumberger Resource Management Services, Inc.*, Case No. 01-77, Aug. 8, 2001.

Reply and Affirmative Defenses to Schlumberger's Counterclaims Filed in Response to ABB's Second Amended Complaint, In the United States District Court for the District of Delaware, *ABB Automation, Inc., v. Schlumberger Resource Management Services, Inc.*, Case No. 01-77, Aug. 21, 2001.

Schlumberger's Answers to ABB's Second Set of Interrogatories (No. 23), In the United States District Court for the District of Delaware, *ABB Automation, Inc., v. Schlumberger Resource Management Services, Inc.*, Case No. 01-77, Jul. 16, 2002.

ABB's Second Supplemental Responses and Objections to Schlumberger's First Set of Interrogatories (Nos. 1-29), In the United States District Court for the District of Delaware, *ABB Automation, Inc., v. Schlumberger Resource Management Services, Inc.*, Case No. 01-77, Mar. 18, 2002.

ABB's First Supplemental Responses and Objections to Schlumberger's Second Set of Interrogatories (Nos. 30-31), In the United States District Court for the District of Delaware, *ABB Automation, Inc., v. Schlumberger Resource Management Services, Inc.*, Case No. 01-77SLR, Mar. 18, 2002.

ABB's Response and Objections to Schlumberger's Third Set of Interrogatories (No. 32), In the United States District Court for the District of Delaware, *ABB Automation, Inc., v. Schlumberger Resource Management Services, Inc.*, Case No. 01-77SLR, Mar. 25, 2002.

ABB's Second Set of Interrogatories (No. 23), In the United States District Court for the District of Delaware, *ABB Automation, Inc., v. Schlumberger Resource Management Services, Inc.*, Case No. 01-77SLR, Jun. 19, 2002.

Videotaped Deposition upon Oral Examination of Glenn A. Mayfield(Including Exhibits), In the United States District Court for the District of Delaware, *ABB Automation, Inc., v. Schlumberger Resource Management Services, Inc.*, Case No. 01-77SLR, Aug. 20, 2002.

ABB's Third Supplemental Responses and Objections to Schlumberger's First Set of Interrogatories (Nos. 1-29), In the United States District Court for the District of Delaware, *ABB Automation, Inc., v. Schlumberger Resource Management Services, Inc.*, Case No. 01-77SLR, Sep. 5, 2002.

ABB's Final Supplemental Response and Objections to Schlumberger's Interrogatories, In the United States District Court for the District of Delaware, *ABB Automation, Inc., v. Schlumberger Resource Management Services, Inc.*, Case No. 01-77SLR, Sep. 6, 2002.

Memorandum Order(Summary Judgment Order), In the United States District Court for the District of Delaware, *ABB Automation, Inc., v. Schlumberger Resource Management Services, Inc.*, Case No. 01-77SLR, Mar. 27, 2003.

Quantum® Technical Guide- Jul. 1989, no date.

* cited by examiner

APPARATUS FOR METERING AT LEAST ONE TYPE OF ELECTRICAL POWER OVER A PREDETERMINED RANGE OF SERVICE VOLTAGES

RELATED APPLICATION DATA

This application is a Continuation of application Ser. No. 10/076,990 filed Feb. 15, 2002 now abandoned, which is a Continuation of Ser. No. 09/781,501 filed Feb. 12, 2001, which is a Divisional of Ser. No. 09/047,479 filed Mar. 25, 1998, now U.S. Pat. No. 6,229,295, issued May 8, 2001, which is a Continuation of Ser. No. 08/478,605 filed Jun. 7, 1995, now U.S. Pat. No. 5,903,145, issued May 11, 1999, which is a Continuation of Ser. No. 08/384,398, filed Feb. 3, 1995, now U.S. Pat. No. 5,457,621, issued Oct. 10, 1995, which is a Continuation of Ser. No. 08/259,116 filed Jun. 10, 1994 (now abandoned), which is a Continuation of Ser. No. 07/839,967 filed Feb. 21, 1992 (now abandoned).

FIELD OF INVENTION

The present invention relates generally to the field of electric utility meters. More particularly, the present invention relates to electronic utility watthour meters or meters utilized to meter real and reactive energy in both the forward and reverse directions.

BACKGROUND OF THE INVENTION

Electric utility companies and power consuming industries have in the past employed a variety of approaches to metering electrical energy. Typically, a metering system monitors power lines through isolation and scaling components to derive polyphase input representations of voltage and current. These basic inputs are then selectively treated to determine the particular type of electrical energy being metered. Because electrical uses can vary significantly, electric utility companies have requirements for meters configured to analyze several different nominal primary voltages. The most common of these voltages are 120, 208, 240, 277 and 480 volts RMS. Presently, available meters have a different style for each of these applications, both electro-mechanical and electronic. This forces the electric utility companies to inventory, test and maintain many different styles of meters. Consequently, a need exists for reducing the number of meter types a utility need inventory by providing a meter capable of operation over a wide dynamic range.

The problem of wide amperage dynamic range was addressed in U.S. Pat. No. 3,976,941—Milkovic. It was there recognized that solid state electronic meters were becoming more desirable in metering applications, however, such solid state meters had a critical drawback in their amperage dynamic range. An effort was described to improve the amperage dynamic range of solid state meters so that such meters would be operationally equivalent to prior electromechanical meters. The problem with such meters, however, was their failure to address the multiple voltage situation. Utility companies utilizing such meters would still be forced to inventory, test and maintain many different styles of meters in order to service the various voltages provided to customers.

It has been recognized in various meter proposals that the use of a microprocessor would make metering operations more accurate. It will be understood, however, that the use of a microprocessor requires the provision of one or more supply voltages. Power supplies capable of generating a direct current voltage from the line voltage have been used for this purpose. Since electric utility companies have requirements for various nominal primary voltages, it has been necessary to provide power supplies having individualized components in order to generate the microprocessor supply voltages from the nominal primary voltage.

Consequently, a need exists for a single meter which is capable of metering electrical energy associated with nominal primary voltages in the range from 96 to 528 volts RMS. Applicants resolve the above problems through the use of a switching power supply and voltage dividers. It will be recognized that switching power supplies are known. However, the use of such a power supply in an electrical energy meter is new. Moreover, the manner of the present invention, the particular power supply construction and its use in an electrical energy meter is novel.

It will also be noted, in order to solve the inventory problem, designing a wide voltage range meter in the past involved the use of voltage transformers to sense line voltage. A significant problem associated with the use of such transformers was the change in phase shift and the introduction of non-linearities that would occur over a wide voltage range. It was not to remove such a widely changing phase shift or to compensate for the non-linearities.

Consequently, a need still exists for a single meter which is capable of metering electrical energy associated with nominal primary voltages that also minimizes phase shift in the voltage sensors over a wide voltage range.

SUMMARY OF THE INVENTION

The present invention is directed to a power supply for an apparatus for metering at least one type of electrical power over a predetermined range of service voltages supplied by electrical service providers, where the apparatus comprises a voltage input circuit connected to receive a voltage component, and a processing unit. The power supply comprises a surge protection circuit which receives an input voltage, a rectifier circuit which receives an alternating current voltage from the surge protection circuit and outputs a rectified direct current voltage, a transformer which receives the rectified direct current voltage at a first winding so that current flows through the first winding, and a second winding defines an unregulated output voltage of the power supply, a switching device for permitting and preventing the flow of current through the first winding in response to a control signal, and a controller for generating the control signal based on the voltage across the third winding. The control signal output by the controller operates to disable the switching member.

According to another feature of the present invention, the output of the power supply is input to a linear regulator, which outputs a regulated voltage. The regulated voltage is less than the output voltage, and the regulated voltage is output to a precision voltage reference generator. The unregulated voltage is input to the apparatus to determine the presence of a power fail condition.

According to yet another feature, the power supply comprises a non-volatile supply, and the regulated voltage is input to the non-volatile supply, such that the apparatus is switched to the non-volatile supply when the regulated voltage is not present.

BRIEF DESCRIPTION OF THE DRAWINGS

The present invention will be better understood, and its numerous objects and advantages will become apparent to those skilled in the art by reference to the following detailed description of the invention when taken in conjunction with the following drawings, in which.

DETAILED DESCRIPTION

Figure 1:
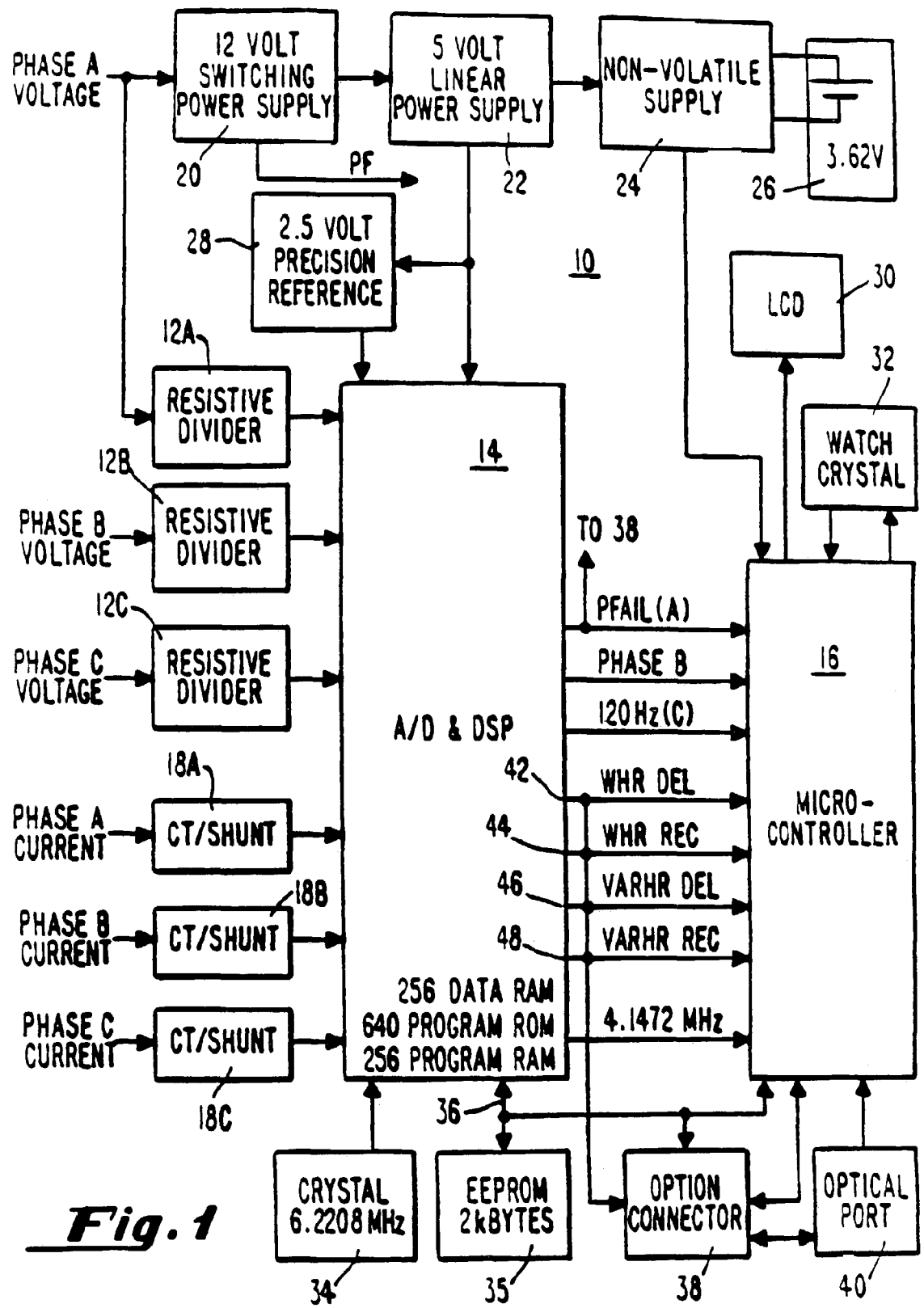
FIG. 1 is a block diagram of an electronic meter constructed in accordance with the present invention.

A new and novel meter for metering electrical energy is shown in FIG. 1 and generally designated 10. It is noted at the outset that this meter is constructed so that the future implementation of higher level metering functions can be supported. Meter 10 is shown to include three resistive voltage divider networks 12A, 12B, 12C: a first processor—an ADC/DSP (analog-to-digital converter/digital signal processor) chip 14: a second processor—a microcontroller 16 which in the preferred embodiment is a Mitsubishi Model 50428 microcontroller: three current sensors 18A, 18B, 18C; a 12V switching power supply 20 that is capable of receiving inputs in the range of 96–528V; a 5V linear power supply 22: a non-volatile power supply 24 that switches to a battery 26 when 5V supply 22 is inoperative; a 2.5V precision voltage reference 28; a liquid crystal display (LCD) 30; a 32.768 kHz oscillator 32; a 6.2208 MHz oscillator 34 that provides timing signals to chip 14 and whose signal is divided by 1.5 to provide a 4.1472 MHz clock signal to microcontroller 16; a 2 kByte EEPROM 35; a serial communications line 36; an option connector 38: and an optical communications port 40 that may be used to read the meter. The inter-relationship and specific details of each of these components is set out more fully below.

It will be appreciated that electrical energy has both voltage and current characteristics. In relation to meter 10 voltage signals are provided to resistive dividers 12A–12C and current signals are induced in a current transformer (CT) and shunted. The output of CT/shunt combinations 18A–18C is used to determine electrical energy.

First processor 14 is connected to receive the voltage and current signals provided by dividers 12A–12C and shunts 18A–18C. As will be explained in greater detail below, processor 14 converts the voltage and current signals to voltage and current digital signals, determines electrical energy from the voltage and current digital signals and generates an energy signal representative of the electrical energy determination. Processor 14 will always generate a watthour delivered (Whr Del) and, watthour received (Whr Rec), depending on the type of energy being metered, will generate either a volt amp reactive hour delivered (Varhr Del)/a volt amp reactive hour received (Varhr Rec) signal or volt amp hour delivered (Vahr Del)/volt amp hour received (Vahr Rec) signal. In the preferred embodiment, each transition on conductors 42–48 (each logic transition) is representative of the measurement of a unit of energy. Second processor 16 is connected to first processor 14. As will be explained in greater detail below, processor 16 receives the energy signal(s) and generates an indication signal representative of said energy signal.

It will be noted again that meter 10 is a wide range meter capable of metering over a voltage range from 96–528V. The components which enhance such a wide range meter include the divider network 12A–12C, which as previously noted are connected to receive the voltage component. The dividers generate a divided voltage, wherein the divided voltage is substantially linear voltage with minimal phase shift over the wide dynamic range, i.e. 96–528 Volts. A processing unit (processors 14 and 16) are connected to receive the divided voltage and the current component. The processing unit processes the divided voltages and the current components to determine electrical energy metering values. It will be appreciated from the following description that processors 14 and 16 require stable supply voltages to be operable. A power supply, connected to receive the voltage component and connected to processors 14 and 16, generate the necessary supply voltages from the Phase A voltage component over the wide dynamic range. Power supply 20 could also run off of phase B and phase C voltages or a combination of the above. However, a combination embodiment would require additional protection and rectifying components.

In relation to the preferred embodiment of meter 10, currents and voltages are sensed using conventional current transformers (CT's) and resistive voltage dividers, respectively. The appropriate multiplication is accomplished in a new integrated circuit, i.e. processor 14. Processor 14 is essentially a programmable digital signal processor (DSP) with built in multiple analog to digital (A/D) converters. The converters are capable of sampling multiple input channels simultaneously at 2400 Hz each with a resolution of 21 bits and then the integral DSP performs various calculations on the results. For a more detailed description of Processor 14, reference is made to U.S. Pat. No. 5,555,508, which is incorporated herein by reference and which is owned by the same assignee as the present application.

Meter 10 can be operated as either a demand meter or as a time-of-use (TOU) meter. It will be recognized that TOU meters are becoming increasingly popular due to the greater differentiation by which electrical energy is billed. For example, electrical energy metered during peak hours will be billed differently than electrical energy billed during non-peak hours. As will be explained in greater detail below, first processor 14 determines units of electrical energy while processor 16, in the TOU mode, qualifies such energy units in relation to the time such units were determined, i.e. the season as well as the time of day.

All indicators and test features are brought out through the face of meter 10, either on LCD 30 or through optical communications port 40. Power supply 20 for the electronics is a switching power supply feeding low voltage linear supply 22. Such an approach allows a wide operating voltage range for meter 10.

In the preferred embodiment of the present invention, the so-called standard meter components and register electronics are for the first time all located on a single printed circuit board (not shown) defined as an electronics assembly. This electronics assembly houses power supplies 20, 22, 24 and 28, resistive dividers 12A–12C for all three phases, the shunt resistor portion of 18A–18C, oscillator 34, processor 14, processor 16, reset circuitry, EEPROM 35, oscillator 32, optical port components 40, LCD 30, and an option board interface 38. When this assembly is used for demand metering, the billing data is stored in EEPROM 35. This same assembly is used for TOU metering applications by merely utilizing battery 26 and reprogramming the configuration data in EEPROM 35. The additional time-of-use billing data is stored in the internal RAM of processor 16, which RAM is backed by battery 26.

Consider now the various components of meter 10 in greater detail. Primary current being metered may be sensed using conventional current transformers. The shunt resistor portion of devices 18A–18C are located on the electronics assembly.

The phase voltages are brought directly to the electronic assembly where resistive dividers 12A–12C scale these inputs to processor 14. In the preferred embodiment, the electronic components are referenced to the vector sum of each line voltage for three wire delta systems and to earth ground for all other services. Resistive division is used to divide the input voltage so that a very linear voltage with minimal phase shift over a wide dynamic range can be obtained. This in combination with a switching power supply allows the wide voltage operating range to be implemented.

Figure 2:
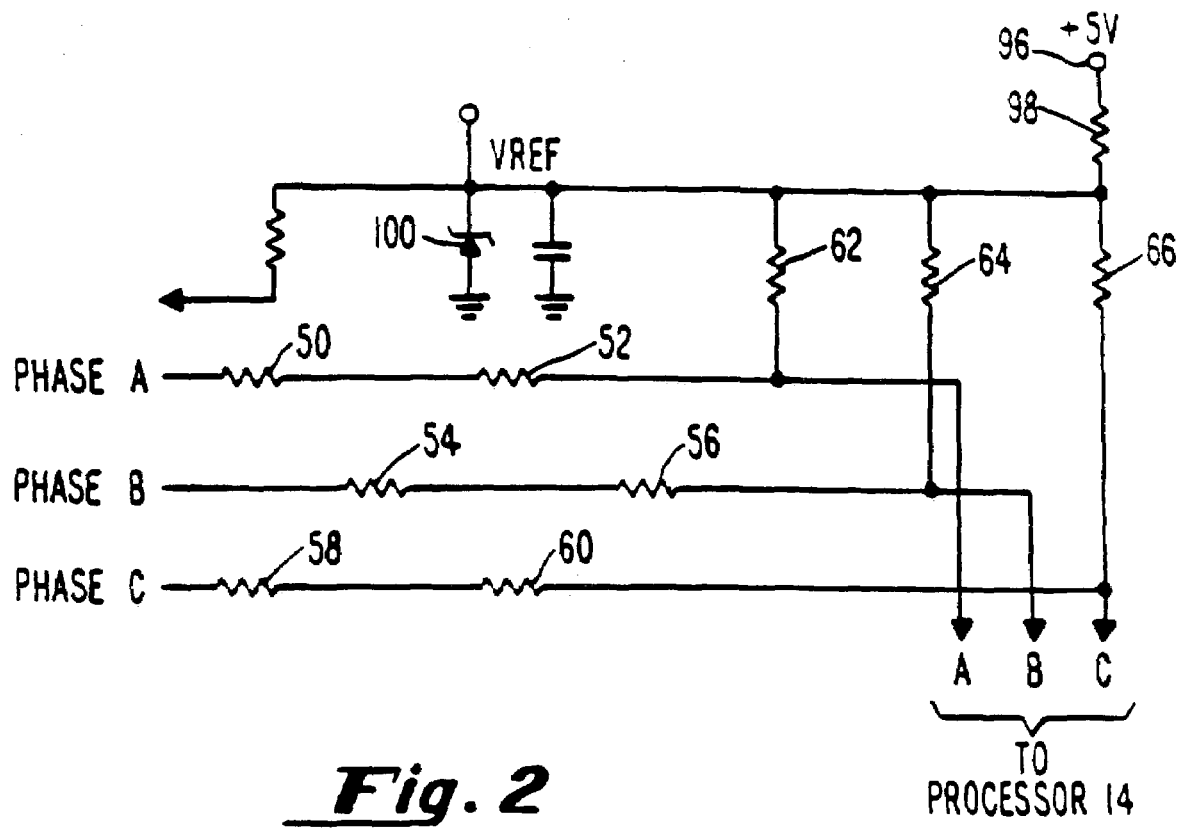
FIG. 2 is a schematic diagram of the resistive dividers shown in FIG. 1.
Figure 3:
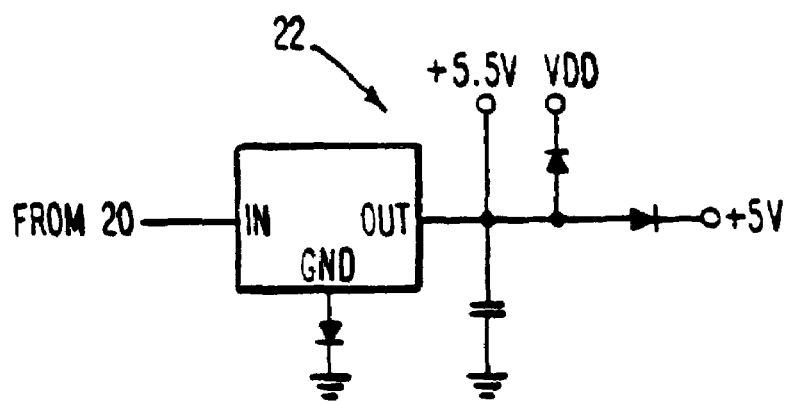
FIG. 3 is a schematic diagram of the linear power supply shown in FIG. 1.

Referring briefly to FIG. 2, each resistive divider consists of two 1 Meg, 1/2 watt resistors 50/52, 54/56 and 58/60, respectively. Resistors 50–60 are used to drop the line voltage at an acceptable watt loss. Each resistor pair feeds a resistor 62, 64 and 66, respectively. Resistors 62–66 are metal film resistors having a minimal temperature coefficient. This combination is very inexpensive compared to other voltage sensing techniques. Resistors 50–60 have an operating voltage rating of 300 Vrms each. These resistors have been individually tested with the 6 kV IEEE 587 impulse waveforms to assure that the resistance is stable and that the devices are not destroyed. Resistors 62–66 scales the input voltage to be less than 1 Volt peak to peak to processor 14. Resistors 62–66 should be in the range of from about 100 ohms to about 1 K ohms to assure this maximum voltage and maintain maximum signal.

On grounded, three wire delta systems, those components of the electronics assembly operating on logic voltage levels (including the battery connector) can be at an elevated voltage. In such situations, the two, 1 Meg resistor combinations (50/52, 54/56, 58/60) provide current limiting to the logic level electronics. The worse case current occurs during testing of a 480 V, 3 wire delta meter with single phase excitation.

It will be appreciated that energy units are calculated in processor 14 primarily from multiplication of voltage and current. The preferred embodiment of processor 14, referenced above as being described in U.S. Pat. No. 5,555,508, includes three analog to digital converters. The necessity for three converters is primarily due to the absense of voltage transformers, present in prior meters.

The M37428 microcontroller 16 is a 6502 (a traditional 8 bit microprocessor) derivative with an expanded instruction set for bit test and manipulation. This microcontroller includes substantial functionality including internal LCD drivers (128 quadraplexed segments), 8 kbytes of ROM, 384 bytes of RAM, a full duplex hardware UART, 5 timers, dual clock inputs (32.768 kHz and up to 8 MHz), and a low power operating mode.

During normal operation, processor 16 receives the 4.1472 MHz clock from processor 14 as described above. Such a clock signal translates to a 1.0368 MHz cycle time. Upon power fail, processor 16 shifts to the 32.768 kHz crystal oscillator 32. This allows low power operation with a cycle time of 16.384 kHz. During a power failure, processor 16 keeps track of time by counting seconds and rippling the time forward. Once processor 16 has rippled the time forward, a WIT instruction is executed which places the unit in a mode where only the 32.768 kHz oscillator and the timers are operational. While in this mode a timer is setup to "wake up" processor 16 every 32,768 cycles to count a second.

Consider now the particulars of the power supplies shown in FIG. 1. As indicated previously, the off-line switching supply 20 is designed to operate over a 96–528 VAC input range. It connects directly to the Phase A voltage alternating current (AC) line and requires no line frequency transformer. A flyback converter serves as the basis of the circuit. A flyback converter is a type of switching power supply.

As used herein, the "AC cycle" refers to the 60 Hz or 50 Hz input to power supply 20. The "switching cycle" refers to the 50 kHz to 140 kHz frequency at which the switching transformer of power supply 20 operates. It will be noted that other switching cycle frequences can be used.

Figure 4:
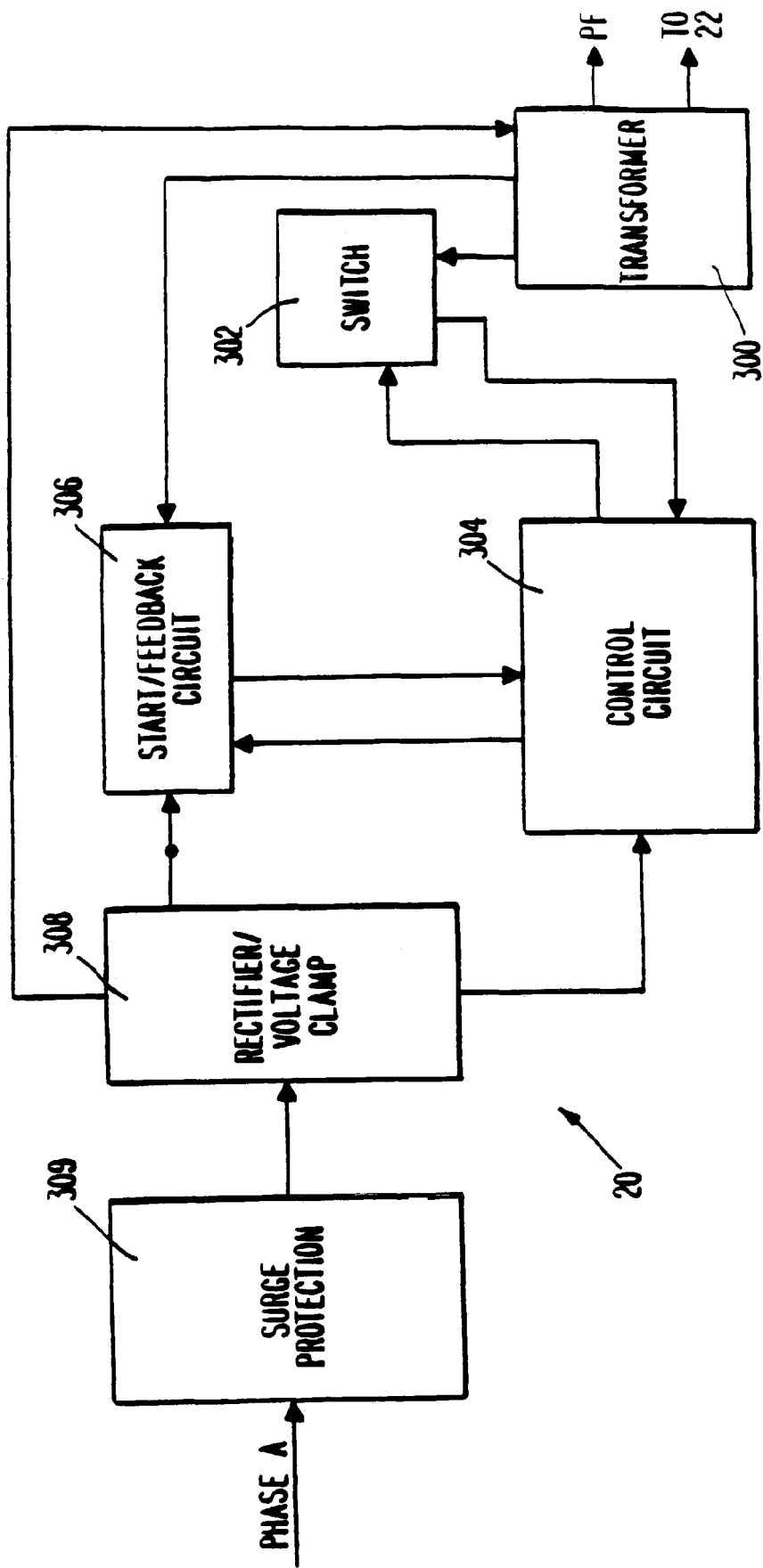
FIG. 4 is a block diagram of the power supply shown in FIG. 1.

Referring now to FIG. 4, power supply 20 for use in electronic meters includes a transformer 300 having primary and secondary windings. The input voltage (Phase A Voltage) is provided to the primary winding so that current may flow therethrough. As will be appreciated from FIG. 5, the secondary winding defines the output of the power supply. Referring back to FIG. 4, a switching member 302 is connected to the primary winding of transformer 300. Switching member 302 permits and prevents the flow of current through the primary winding. Switch member 302 is operable in response to a control signal, which control signal is generated by control circuit 304. Controller 304 generates the control signal in response to a limit signal generated by the start/feedback circuit 306 in response to the output of power supply 20. Voltage clamp 308 serves to limit the voltage applied to transformer 300 and switch 302. Surge protection circuit 309 is provided at the input to protect against surges appearing in the Phase A voltage.

Figure 5:
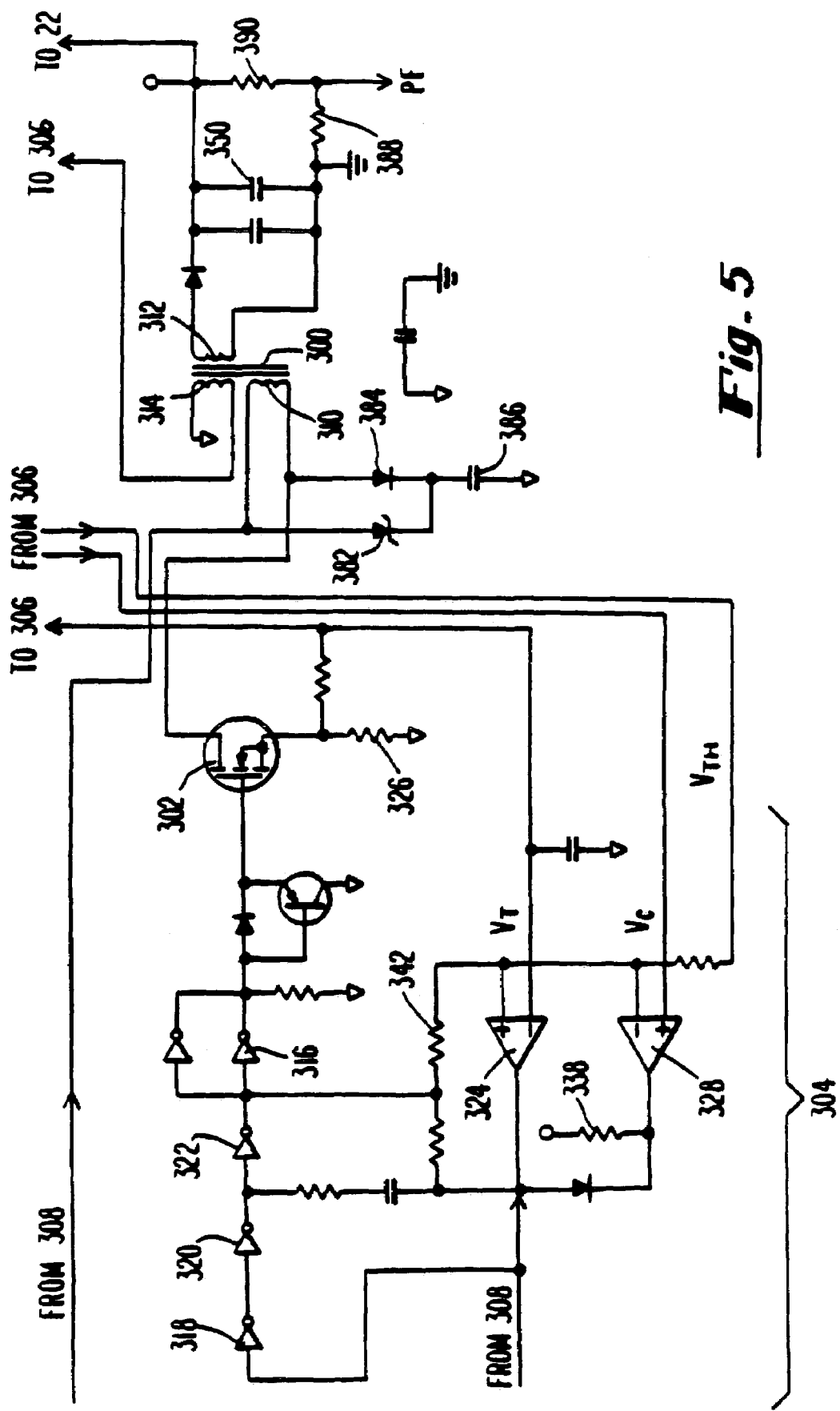
FIG. 5 is a schematic diagram of the control and switching members shown in FIG. 4.

Referring now to FIG. 5, transformer 300 and switch 302 are shown in greater detail. It will be appreciated that switch 302 is a transistor. At the beginning of each switching cycle, transistor 302 "turns on", i.e. becomes conductive, and magnetizes the core of transformer 300 by applying voltage across the primary 310. At the end of each cycle, transistor 302 turns off and allows the energy stored in the core of transformer 300 to flow to the output of the power supply, which "output" can be generally defined by secondary 312. Simultaneously, energy flows out of the bootstrap or tertiary winding 314 to power the control circuitry 304.

Feedback circuit 306 and controller 304 control the output of power supply 20 by varying the ON time of transistor 302. Controller 304 will be described in greater detail in relation to FIG. 5. Transistor 302 is connected through inverter 316 to receive the output of an oscillator formed from inverters 318, 320 and 322. It will be recognized that such inverters form a ring oscillator. The oscillator has a free-run frequency of 50 KHz. The ON time of transistor 302 may vary between 200 ns and 10 µs. The OFF time is always between 8 and 10 µs. During operation, the bootstrap winding 314 of transformer 300 (pins 10 and 11) powers controller 304, but this power is not available until the power supply has started. The control circuit is a current-mode regulator.

At the beginning of a switching cycle, transistor 302 is turned ON by the oscillator output. If left alone, transistor 302 would also be turned OFF by the oscillator output. Transistor 302 remains ON until the current in primary 310 of transformer 300 (pins 8 and 13) ramps up to the threshold current level $I_{th}$ represented as a voltage $V_{th}$. As will be explained below, $V_{th}$ is generated by feedback circuit 306. When the primary current of transformer 300, represented as a voltage $V_t$ and sensed by resistor 326, ramps up to the threshold level $V_{th}$, pin 1 of comparator 324 terminates the ON period of the oscillator by forcing the oscillator output HIGH, which output in turn is inverted by inverter 316, shutting OFF transistor 302. Transistor 302 then turns OFF until the next switching cycle. Since the $V_{th}$ indirectly controls the ON time of transistor 302, controller 304 regulates the output voltage of the power supply by comparing the sensed current in transformer 300 to this threshold level.

Transistor 362 and pin 7 of comparator 326 can disable the oscillator. Transistor 362, described in greater detail in FIG. 7, disables the oscillator when the line voltage exceeds 400 volts. Comparator 328 disables the oscillator when the controller 304 has insufficient voltage to properly drive transistor 302. The voltage in controller 304, VC, will be described in relation to FIG. 5.

Figure 6:
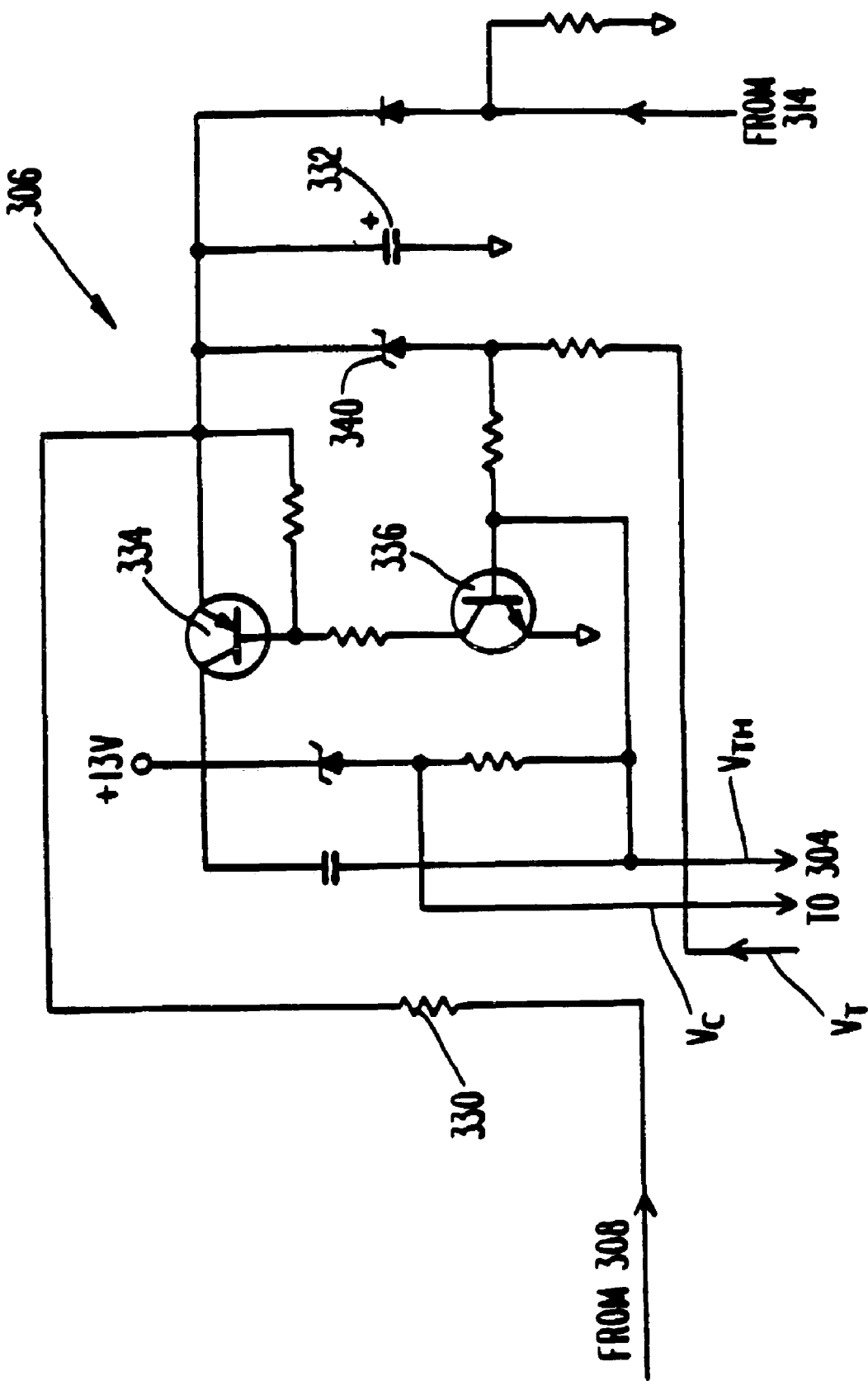
FIG. 6 is a schematic diagram of the startup/feedback shown in FIG. 4.

Consider now feedback circuit 306, shown in FIG. 6. When connected to the Phase A Voltage, resistor 330 slowly charges capacitor 332. The high value of resistor 330 and the 400 volt limit by voltage clamp 308 limit the power dissipation of resistor 330. After a few seconds, capacitor 332 charges above 13 volts. Transistors 334 and 336 then provide positive feedback to each other and snap ON. Controller 304 can run for tens of milliseconds from the charge stored in capacitor 332. Normally, power supply 20 will successfully start and begin to power itself in this period. If it fails to start, transistors 334 and 336 turn OFF when the charge across capacitor 332 drops below 8.5 volts and capacitor 332 again charges through resistor 330. This cycle repeats until the supply starts.

With high input voltages and without resistor 338 (FIG. 5), the current sourced by resistor 330 can hold the control and start-up circuits in a disabled state that does not recycle. When Capacitor 332 drops below 8.5 volts, resistor 338 places a load on the control circuit supply. This load insures that the start-up circuit recycles properly with high input voltages.

As indicated above, when the primary current of transformer 300 sensed by resistor 326 ramps up to the threshold level $V_{th}$, pin 1 of comparator 324 can terminate the ON period of the oscillator. When the voltage on capacitor 332 is less than 13 volts, zener diode 340 provides no voltage feedback. Under these conditions, the base-emitter voltage of transistor 336 sets the current threshold $I_{th}$ to about 650 mA. This maximum current limit protects transistor 302, as well as those transistors in voltage clamp 306, and prevents transformer 300 from saturating.

As the voltage on capacitor 332, which is representative of the output voltage of the supply, approaches the proper level, zener diode 340 begins to conduct and effectively reduces the current threshold, i.e. effectively reduces $V_{th}$. Each switching cycle will then transfers less power to the output, and the supply begins to regulate its output.

When the regulating circuitry requires ON times of transistor 302 less than about 400 ns, the current sense circuitry does not have time to react to the primary current of transformer 300. In that case, the regulating circuit operates as a voltage-mode pulse width modulator. Resistor 342 (FIG. 5) generates a negative step at pin 3 of comparator 324 at the beginning of each switching cycle. The regulator feedback voltage at pin 2 of comparator 324, which contains little current information at the beginning of each switching cycle, translates the step at pin 3 into various input overdrives of comparator 324, thereby driving the output of comparator 324 to a logic HIGH level. The propagation time of the comparator 324 decreases with increasing overdrive, i.e. as the negative step increases, and the circuit acts as a pulse width modulator. The negative step will increase due to the changing level of $V_{th}$.

Any leakage inductance between the bootstrap winding (pins 10 and 11 of transformer 300) and the output winding (pins 3 and 4 of transformer 300) causes inaccurate tracking between the voltage on capacitor 332 and the output voltage of the supply. This leakage inductance can cause poor load regulation of the supply. The bootstrap and output windings are bifilar wound; they are tightly coupled, have little leakage inductance, and provide acceptable load regulation. Since the two windings are in direct contact, the bootstrap winding requires Teflon insulation to meet the isolation voltage specifications. A 100% hi-pot test during manufacture insures the integrity of the insulation.

Figure 7:
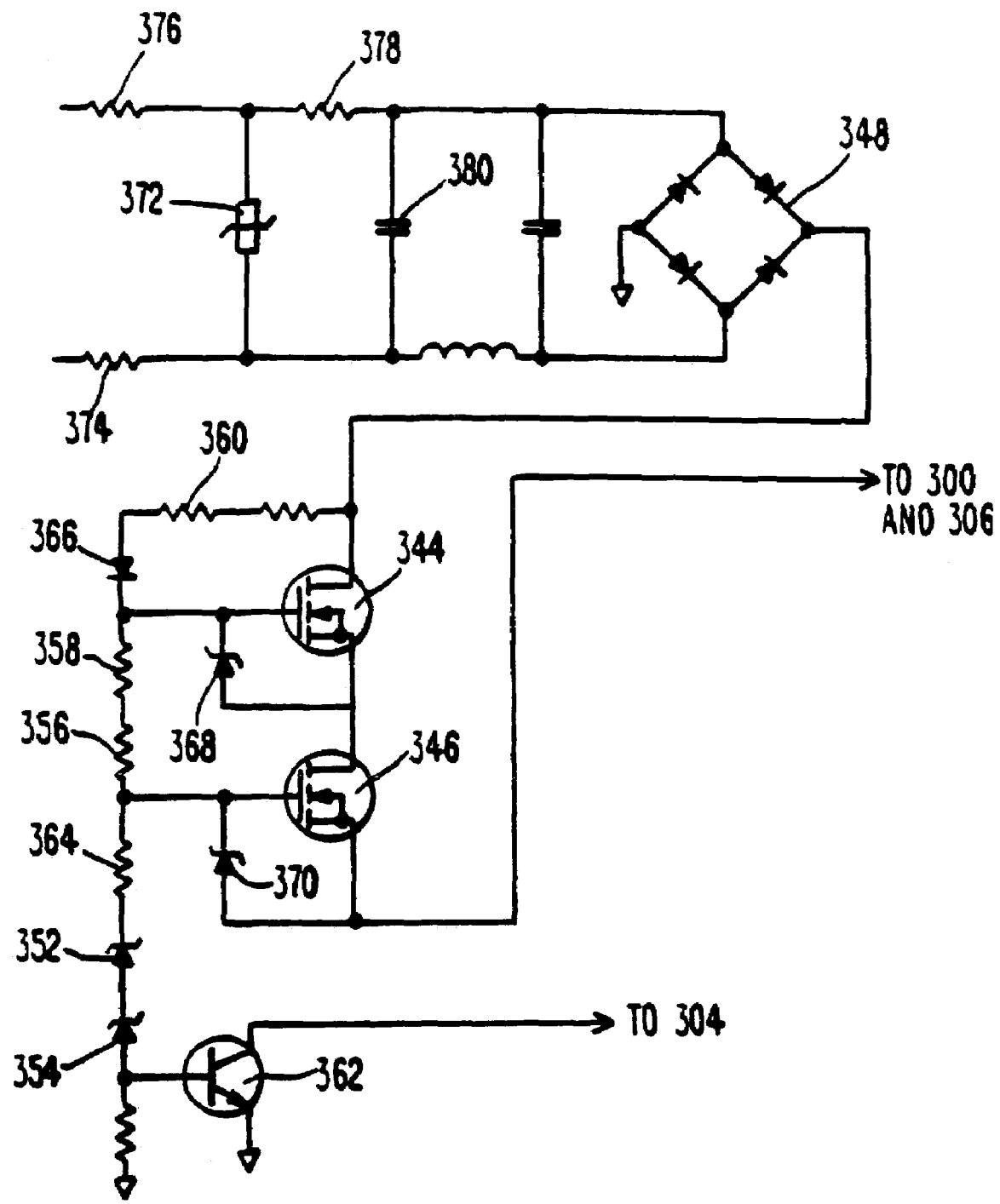
FIG. 7 is a schematic diagram of the voltage clamp shown in FIG. 4.

Consider now the details of voltage clamp 308, shown in FIG. 7. A 528 VAC input corresponds to 750 VDC after rectification. Switching transistors that can directly handle these voltages are extremely expensive. By using the voltage clamp of the present invention, relatively inexpensive switching transistors can be utilized.

In power supply 20, the switching member 302 is shut down during parts of the AC cycle that exceed 400 volts. The switching transistor, transistor 302, in conjunction with two other transistors 344 and 346, can hold off 750 VDC. During surge conditions, these three transistors can withstand over 1500 volts. In the preferred embodiment, transistors 302, 344 and 346 are 600-volt MOSFETs.

Because high-voltage electrolytic capacitors are expensive and large, this voltage clamp 308 has no bulk filter capacitor after the bridge rectifier 348. Without a bulk filter capacitor, this switching converter must shut down during parts of the AC cycle. It intentionally shuts down during parts of the AC cycle that exceed 400 volts, and no input power is available when the AC cycle crosses zero. The 2200 μF output capacitor 350 (FIG. 5), provides output current during these periods.

As discussed above, transistors 344 and 346 act as a voltage clamp and limit the voltage applied to switching member 302. At a 528 VAC line voltage, the input to the clamping circuit reaches 750 volts. During lightning-strike surges, this voltage may approach 1500 volts. When the voltage at the output of bridge rectifier 348 exceeds 400 volts, zener diodes 352 and 354 begin to conduct. These diodes, along with the 33 KΩ resistors 356, 358 and 360, create bias voltages for transistors 344 and 346. Transistors 344 and 346 act as source followers and maintain their source voltages a few volts below their gate voltages.

If, for example, the output of bridge rectifier 348 is at 1000 volts, the gates of transistors 344 and 346 will be at approximately 400 and 700 volts respectively. The source of transistor 344 applies roughly 700 volts to the drain of 346; the source of 346 feeds about 400 volts to switching member 302. Transistors 344 and 346 each drop 300 volts under these conditions and thereby share the drop from the 1000 volt input to the 400 volt output, a level which the switching converter 302 can withstand.

As zener diodes 352 and 354 begin to conduct and as transistors 344 and 346 begin to clamp, transistor 362 turns ON and shuts down the switching converter. Although transistors 344 and 346 limit the voltage fed to the converter to an acceptable level, they would dissipate an excessive amount of heat if the switching converter 302 consumed power during the clamping period.

When switching converter 302 shuts down, transistor 302 no longer has to withstand the flyback voltage from transformer 300. Resistor 364 takes advantage of this by allowing the output voltage of the clamp to approach 500 volts (instead of 400 volts) as the input to the clamp approaches 1500 volts. This removes some of the burden from transistors 344 and 346.

Zener diodes 352 and 354 are off and the converter 302 runs when the output of bridge rectifier 348 is below 400 volts. During these parts of the AC cycle, the 33 KΩ resistors 356, 358 and 360 directly bias the gates of transistors 344 and 346. The voltage drop across transistors 344 and 346 is then slightly more than the threshold voltages of those transistors along with any voltage drop generated by the channel resistance of those transistors.

During the off time of transistor 302, about 10 μS, the 33 KΩ resistors can no longer bias the gates of transistors 344 and 346. Diode 366 prevents the gate capacitance of transistors 344 and 346 and the junction capacitance of zeners 368 and 370 from discharging when transistor 302 is off. This keeps transistors 344 and 346 ON and ready to conduct when transistor 302 turns ON at the next switching cycle. If the gates of transistors 344 and 346 had discharged between switching cycles, they would create large voltage drops and power losses during the time required to recharge their gates through the 33 KΩ resistors.

In the preferred embodiment, two 33 KΩ resistors are used in series to obtain the necessary voltage capability from 966 surface-mount packages.

This power supply must withstand an 8 KV, 1.2×50 μS short-branch test. Varistor 372, resistors 374, 376 and 378, and capacitor 380 protect the power supply from lightning strike surges.

A 550 VAC varistor 372 serves as the basis of the protection circuit. It has the lowest standard voltage that can handle a 528 VAC input. The device has a maximum clamping voltage of 1500 volts at 50 amps.

A varistor placed directly across an AC line is subject to extremely high surge currents and may not protect the circuit effectively. High surge currents can degrade the varistor and ultimately lead to catastrophic failure of the device. Input resistors 374 and 376 limit the surge currents to 35 amps. This insures that the clamping voltage remains below 1500 volts and extends the life of the varistor to tens of thousands of strikes.

Resistor 378 and capacitor 380 act as an RC filter. The filter limits the rate of voltage rise at the output of the bridge rectifier. The voltage clamping circuit, transistors 344 and 346, is able to track this reduced dv/dt. Current forced through diodes 382, 384 and capacitor 386 (FIG. 5) is also controlled by the limited rate of voltage rise.

Resistors 374 and 376 are 1 watt carbon composition resistors. These resistors can withstand the surge energies and voltages. Resistor 378 is a flame-proof resistor that acts as a fuse in the event of a failure in the remainder of the circuit.

The values of resistors 374, 376 and 378 are low enough so that they do not interfere with the operation of the power supply or dissipate excessive amounts of power.

Finally it is noted that resistors 388 and 390 act to generate the power fail voltage PF.

By using the wide voltage ranging of the invention, a single meter can be used in both a four wire wye application as well as in a four wire delta application. It will be recognized that a four wire delta application includes 96V sources as well as a 208V source. In the past such an application required a unique meter in order to accommodate the 208V source. Now all sources can be metered using the same meter used in a four wire wye application.

While the invention has been described and illustrated with reference to specific embodiments, those skilled in the art will recognize that modification and variations may be made without departing from the principles of the invention as described herein above and set forth in the following claims.

What is claimed is:

1. An electric energy meter for measuring electrical energy usage over a wide dynamic range of standard service voltages, wherein the electrical energy meter is used by an electric utility for customer billing purposes, and wherein the electrical energy meter can be connected to a polyphase electrical service to measure electrical energy on more than one phase, the meter having a power supply comprising:
a transformer having first, second, and third windings, the power supply being capable of receiving any input voltage within the wide dynamic range of standard service voltages, which input voltage is provided to the first winding so that current flows through the first winding, wherein a voltage across the second winding defines an output of the power supply, wherein a voltage across the third winding defines a sense signal that is representative of the output of the power supply, and wherein the output is regulated based at least in part on the sense signal to provide a predetermined output voltage independent of the input voltage, and wherein the wide range of service voltages include RMS voltages between about 96 Vrms and about 528 Vrms.

2. The electric energy meter of claim 1, wherein the third winding is substantially similar to the second winding, so the voltage across the third winding is similar to the voltage across the second winding.

3. The electric energy meter of claim 2, further comprising:
a switching member connected to the first winding;
a controller connected to the switching member and to the third winding, wherein the controller receives the sense signal from the third winding and sends a control signal to the switching member based on the sense signal, and wherein the control signal opens and closes the switching member to permit and prevent a flow of current to the first winding and to regulate the output of the power supply on the second winding.

4. The electric energy meter of claim 3, wherein the control signal operates to disable the switch means.

5. The electric energy meter of claim 3, wherein the switching means comprises a first transistor, connected between the first winding and ground, and wherein the control means comprises an oscillator, connected to the base of the transistor, for generating an oscillating signal for switching the transistor on and off, wherein the control signal causes the output of the oscillator to disable the first transistor.

6. The electric energy meter of claim 5, wherein the first transistor comprises a 600 volt MOSFET device.

7. The electric energy meter of claim 5, wherein the oscillator comprises a ring oscillator.

8. The electric energy meter of claim 3, wherein the control means comprises an over current protection detector and a means for voltage protection control.

9. The electric energy meter of claim 8, wherein the control signal is generated in response to an output of one of the over current protection detector and the means for voltage protection control.

10. The electric energy meter of claim 3, further comprising voltage clamping means, connected to the transformer and the switch means, wherein the input voltage is applied to the voltage clamping means, for limiting the voltage applied to the transformer.

11. The electric energy meter of claim 10, wherein the clamping means comprises first and second transistors and biasing means, connected to the first and second transistors, wherein the biasing means biases the first and second transistors so that the voltage provided by the clamping means does not exceed a desired level.

12. The electric energy meter of claim 11, wherein the clamping means disables the switch means when the input voltage exceeds the desired level.

13. The electric energy meter of claim 1, further comprising a charge means, connected to the second winding, for storing an electrical charge when current is flowing through the first winding and for discharging stored electrical charge when current flowing through the first winding is interrupted.

* * * * *

UNITED STATES PATENT AND TRADEMARK OFFICE
CERTIFICATE OF CORRECTION

| | |
|---|---|
| PATENT NO. | : 7,180,282 B2 |
| APPLICATION NO. | : 10/617844 |
| DATED | : February 20, 2007 |
| INVENTOR(S) | : Fred F. Schleifer et al. |

It is certified that error appears in the above-identified patent and that said Letters Patent is hereby corrected as shown below:

Title Page,
Item (75), Inventors:
Please add the following inventors:
-- Rodney C. Hemminger, Raleigh, NC (US); Mark L. Munday, Raleigh, NC (US) --.

Title Page,
Item (56) References Cited,

OTHER PUBLICATIONS:
Page 3, "Landis & Gyr, "Electronic Meter," reference, delete "2:ZFRI," and insert
-- Class 0,2:ZFRI,--.
Page 3 "Landis & Gyr Bulletin 920 Instruction/Technical Manual," reference, after
"Meter" insert -- Class 20 --.
Page 3, "Landis & Gyr, ZMA 110m402" reference, after "IEC" insert
-- Class 1.0 --.
Page 3, "Laumann, H., et al.," reference, delete "Precision Meter" and insert
-- Class 0,5 Precision Meter --.
Page 3, "ST-Q200 Series System Measurement," reference, delete "Industrues," and insert -- Industries, --.
Page 4, "Usenko, VV et al.," reference, delete "Rarely-Repeateing" and insert
-- Rarely-Repeating --.
Page 4, "Complaint for Patent Infringement" reference, delete "Appl." and insert
--Patent --.
Page 4, "Complaint for Patent Infringement" reference, delete "5,7621,629," and insert -- 5,621,629, --.

Column 1,
Line 9, delete "now abandoned," and insert -- (now abandoned),--.
Line 10, delete "Feb. 12, 2001," and insert -- Feb. 12, 2001 (now abandoned), --.

Column 2,
Line 25, after "not" insert -- easy --.

Column 3,
Line 29, after "supported." a new paragraph should begin with --Meter 10.....--.

Column 7,
Line 19, delete "VC," and insert -- $V_c$, --.

UNITED STATES PATENT AND TRADEMARK OFFICE
CERTIFICATE OF CORRECTION

PATENT NO. : 7,180,282 B2
APPLICATION NO. : 10/617844
DATED : February 20, 2007
INVENTOR(S) : Fred F. Schleifer et al.

It is certified that error appears in the above-identified patent and that said Letters Patent is hereby corrected as shown below:

Column 9,
Line 21, delete "3460N" and insert -- 346 ON --.

Signed and Sealed this

Twenty-third Day of October, 2007

JON W. DUDAS
*Director of the United States Patent and Trademark Office*